(12) United States Patent
Windschitl

(10) Patent No.: US 6,211,468 B1
(45) Date of Patent: Apr. 3, 2001

(54) FLEXIBLE CIRCUIT WITH CONDUCTIVE VIAS HAVING OFF-SET AXES

(75) Inventor: David J. Windschitl, Leander, TX (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 09/132,828

(22) Filed: Aug. 12, 1998

(51) Int. Cl.$^7$ ........................................... H01R 9/09
(52) U.S. Cl. ........................ 174/254; 174/262; 174/266
(58) Field of Search ............................ 174/262, 263, 174/264, 265, 266, 254; 257/774, 698

(56) References Cited

U.S. PATENT DOCUMENTS

| | | | |
|---|---|---|---|
| 3,354,543 | * 11/1967 | Lawrence et al. | 29/853 |
| 4,039,371 | 8/1977 | Brunner et al. | 156/668 |
| 4,050,756 | * 9/1977 | Moore | 439/91 |
| 4,118,523 | 10/1978 | Bingham et al. | 427/97 |
| 4,221,925 | * 9/1980 | Finley et al. | 174/266 |
| 4,303,715 | * 12/1981 | Chang | 428/137 |
| 4,846,929 | 7/1989 | Bard et al. | 156/630 |
| 4,857,143 | 8/1989 | Glenning et al. | 156/668 |
| 4,986,880 | 1/1991 | Dorfman | 156/655 |
| 5,108,553 | 4/1992 | Foster et al. | 205/125 |
| 5,166,097 | 11/1992 | Tanielian | 437/203 |
| 5,227,008 | 7/1993 | Klun et al. | 156/630 |
| 5,227,588 | * 7/1993 | Schreiber et al. | 174/262 |
| 5,288,541 | 2/1994 | Blackwell et al. | 428/209 |
| 5,585,162 | 12/1996 | Schueller | 428/131 |
| 6,010,769 | * 1/2000 | Sasaoka et al. | 428/209 |

* cited by examiner

Primary Examiner—Jeffrey Gaffin
Assistant Examiner—Kamand Cuneo
(74) Attorney, Agent, or Firm—Darla P. Fonseca

(57) ABSTRACT

A flexible circuit includes a flexible non-conductive substrate having a first surface and a second surface. A first electrically conductive trace is provided on the first surface and a second electrically conductive trace is provided on the second surface. A passage extends through the substrate from an end of the first trace to an end of the second trace. The passage includes a beveled opening of a first size formed in the first side and axially aligned with a second beveled opening of the first size formed in the second side. The first and second openings are interconnected by an aperture axially aligned therewith and being of a second size less than the first size. An electrically conductive surface is provided on the passage for electrically interconnecting the first trace and the second trace.

5 Claims, 4 Drawing Sheets

FLEXIBLE CIRCUIT WITH CONDUCTIVE VIAS HAVING OFF-SET AXES

CROSS REFERENCE TO RELATED APPLICATIONS

This application relates to U.S. Pat. No. 5,227,008 issued on Jul. 13, 1993 to Klun et al, the patent being assigned to the assignee of the present invention and being incorporated herein by reference in its entirety.

BACKGROUND

The disclosures herein relate generally to flexible circuits and more particularly to conductive vias provided to interconnect circuit traces on opposite side of the circuit substrate.

The current trend in packages for integrated circuits is to use automated forms of lead bonding such as tape automated bonding (TAB) and flip chip techniques as opposed to the more traditional method of wire bonding. This trend stems from the requirement for increased number of inputs and outputs (I/O) in a package as well as improved reliability, enhanced electrical signal performance and increased yields. To meet these demands, flip-chip packages and multi-chip modules employing flip-chip bonding techniques are beginning to replace more conventional packaging architectures.

Double sided circuits typically are fabricated by forming a conductive pattern on opposing sides of a planar dielectric material and interconnecting the opposing conductive layers with conductive vias. Various processes and techniques, generally involving conventional photolithographic methods, are used to form the conductive circuit patterns on double sided circuits. Photolithographic techniques for forming conductive circuits are explained and well documented in electronic packaging handbooks and in patent literature, e.g. U.S. Pat. No. 5,227,008. Various well-known methods are also used to form vias in the dielectric which separates the conductive layers. Common via forming methods include mechanically punching, drilling, laser ablation, chemical (wet) or plasma etching. These methods have been commonly used to form straight, vertical sidewalls, which terminate at a 90-degree angle with the opposite surfaces of the dielectric material as well as low aspect ratio tapered wall vias. After the via holes are formed in the dielectric, additional processing steps take place to electrically connect the circuit patterns on either side of the dielectric through the via holes. Thus, the vias serve as conductive feedthroughs or conductive through holes.

Although the above mentioned techniques as well as many other methods are available to create the dielectric holes which serve as the openings for the conductive feedthroughs between layers, these methods create vias which have one or more limitations. Foremost among the limitations associated with prevailing via types is the shape of the vias. Common via shapes, with high aspect ratios, serve to both generate and accelerate the accumulation and concentration of the forces which induce stress into the surrounding circuit features. This induced stress often causes premature brittle cracking and failure of the metallic conductors and or causes the conductors to delaminate from the dielectric. Many conventional methods have been tried in the efforts to eliminate these types of stress failures. Some of these methods are described or referenced in U.S. Pat. No. 5,288,541.

Although many methods exist which attempt to eliminate stress failures, they have had only limited success at doing so. As mentioned, the stress generating and stress concentrating nature of conventional vias are due to the problematic shape of the vias. Conventional via shapes do not successfully alleviate the effects of Z-axis movement of the materials used in the construction of the vias. Movement in the Z-direction is distinctly different for all of the materials used in the construction of double sided circuits and vias, and this mismatch of the physical properties of these materials is the source of the stress, often severe, which in turn causes the circuit to fail.

Copper is the most common conductive metal used as the electrical feedthrough in the via. Copper has a well known thermal coefficient of expansion of 17 ppm/°C. In the construction of double sided circuits, copper may be applied (laminated, vapor deposited, etc.) to any number of different types of dielectric materials. Among the more common dielectric materials are polyimide, FR4, BT resin, etc. Polyimide is typical of these dielectric materials in that there are many different types of polyimide which can be either flexible or rigid. Z-axis values of the thermal coefficient of expansion of the commercially available polyimides used to construct double sided circuits are in the ranges of 120 to 140 ppm/°C. Therefore, this substantial difference in the thermal coefficients of expansion of copper and polyimide can cause extremely high stresses in and around the via, especially at the 90 degree angle where the via sidewall intersects the opposite surfaces of the dielectric material. These stresses are cyclic and extremely high in value relative to the tensile strength of the copper. The cyclic nature of the stresses serves to work harden the copper at a point at which the tensile forces in the copper is at a maximum. Over time, often a relatively short time, the tensile strength of the copper decreases due to work hardening. Finally, the copper cracks and ruptures at the 90 degree angle and the circuit fails mechanically and electrically.

Although mismatches of thermal expansion coefficients in the Z direction are the source of much stress associated with conductive vias, there are also many other causes of stress. Some of these stresses are caused by differences in hygroscopic expansion between the metal and the organic substrate, and differences in expansion caused by solvents, organic or otherwise, used in the manufacture, processing, or handling of multilayer circuits, etc.

The many causes of stress in a circuit having vias with conductive feedthroughs, and the poor ability of conventional double sided circuits with conducive vias to effectively limit the effects of the stresses, have therefore created a need for a multilayer circuit, with interconnecting vias which is inherently resistant to the deleterious effects of Z-axis movement and associated stress.

U.S. Pat. No. 5,166,097 discloses a method for making conductive feedthroughs in silicon wafer interposers utilized in silicon wafer multi-chip modules. The feedthroughs are in a silicon wafer substrate rather than the polymeric substrate of a flexible circuit. Due to the conductivity of doped silicone, the feedthroughs must be electrically isolated from each other by applying a layer of dielectric material within the feedthroughs prior to metallizing them. The inherent dielectric properties of a polymeric flexible circuit substrate preclude the need to electrically isolate the feedthroughs. Furthermore, the feedthroughs are fabricated with an anisotropic etching process called orientation-dependent-etching (ODE) such that a high aspect ratio of 400:1 is attained. This type of anisotropic wet etching process relies on the crystal structure of the silicon wafer to provide for such a high aspect ratio. Wet etching of feedthroughs in polymeric flexible circuit substrates are anisotropic but the polymeric material does not permit aspect rations attainable with an ODE etching process.

Therefore, what is needed is a flexible circuit suitable for flip chip and wire bond applications having high I/O's. Moreover, the need for methods of manufacturing a flexible circuit which is capable of meeting increased I/O requirements, at an economical yet reliable fashion, also continues to exist.

SUMMARY

One embodiment, accordingly, provides an apparatus and a method for forming an electrically conductive via in a dielectric substrate which separates opposing conductive layers of a circuit. The conductive vias provide a feedthrough to link the opposing conductive layers and conduct an electrical signal from one conductive layer to the other. To this end, a flexible circuit includes a flexible non-conductive substrate having a first surface and a second surface. A first electrically conductive trace is provided on the first surface and a second electrically conductive trace is provided on the second surface. A passage extends through the substrate from the first trace to the second trace. The passage has an hourglass shaped sidewall which substantially converges between the first and second surfaces, and includes an electrically conductive surface for electrically interconnecting the first trace and the second trace.

A principal advantage of this embodiment is that the number of vias in a given area is substantially increased enabling a greater number of I/O's. The reduction of stress on the copper results in better reliability and longer life of the circuits and vias. Also, a more uniform metallization of the conductive surfaces in the vias is possible.

DETAILED DESCRIPTION OF THE REFERRED EMBODIMENT

Figure 1:
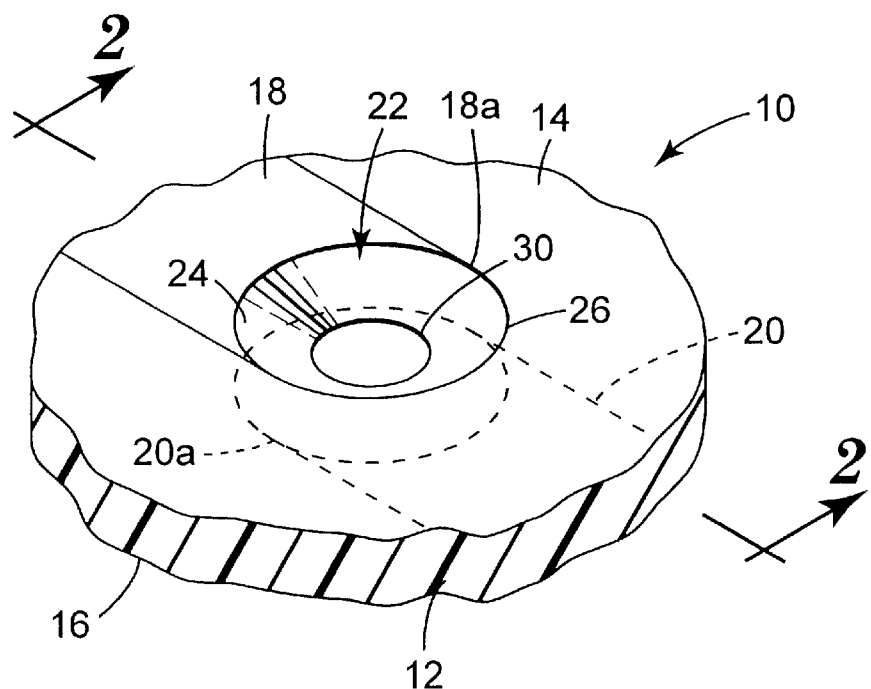
FIG. 1. is an isometric view illustrating an embodiment of a via connecting traces on opposite sides of a substrate.
Figure 2:
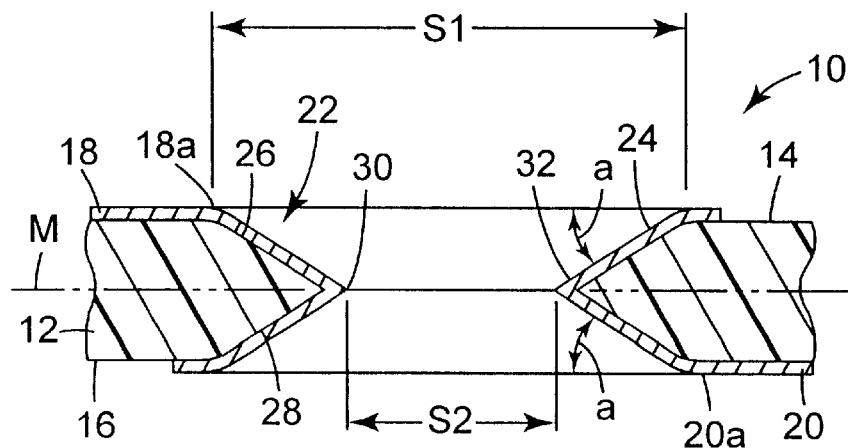
FIG. 2 is a cross-sectional side view taken along the line 2—2 of FIG. 1.

A double-sided flexible circuit is illustrated in FIGS. 1 and 2 and is generally designated 10. Circuit 10 is formed on a flexible non-conductive thin-film substrate 12 having a first surface 14 and a second surface 16. Substrate 12 is formed of an electrically insulating material such as a polymeric film, and is preferably a polyimide film suitable for wet etching (discussed below). A first electrically conductive trace 18 is formed on a first surface 14 and a second electrically conductive trace 20 is formed on second surface 16. A passage or via 22 is formed to extend through substrate 12 from an end 18a of first trace 18 to an end 20a of second trace 20. Via 22 has a substantially hourglass shaped side wall 24, which is formed by simultaneously wet etching substrate 12 from first surface 14 and second surface 16. The via 22 includes a first beveled opening 26 in first surface 14 and a second beveled opening 28 in second surface 16. The opening 26 and 28 are of a first size designated S1, and converge toward a mid-region M of substrate 12 where they are interconnected by an aperture 30 of a second size S2, less than the first size S1. An electrically conductive surface 32 is formed on sidewall 24 for electrically interconnecting first trace 18 and second trace 20.

Figure 3:
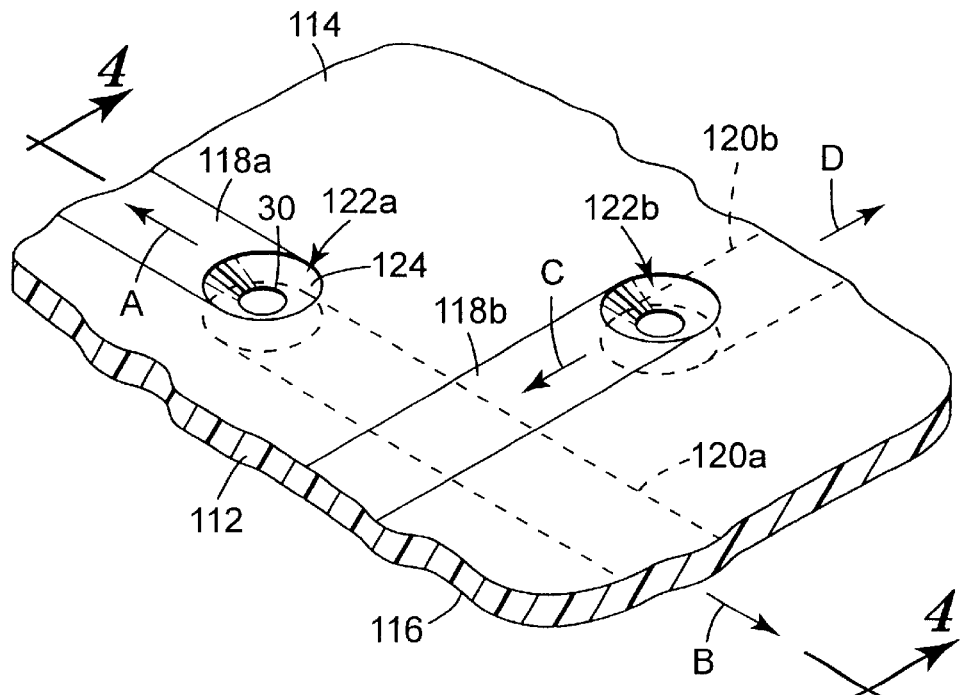
FIG. 3 is an isometric view illustrating an embodiment of a pair of vias connecting overlapping traces on opposite sides of a substrate.
Figure 4:
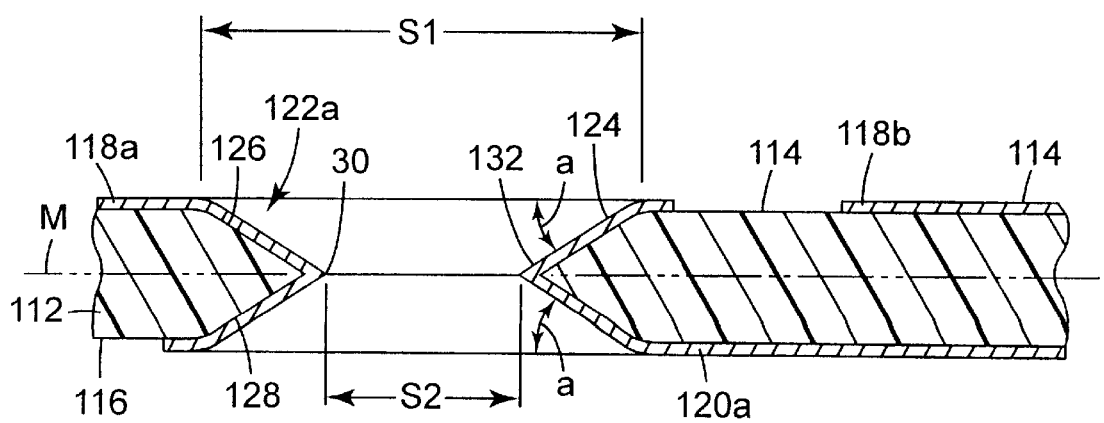
FIG. 4 is a cross-sectional side view taken along the line 4—4 of FIG. 3.

In FIGS. 3 and 4, substrate 112 includes a first surface 114 and an opposite surface 116. A first trace 118a is formed on first surface 114 and a second trace 120a is formed on second surface 116. A via 122a is formed to extend through substrate 112 between trace 118a and trace 120a. Trace 118a extends in a direction designated A, and second trace 120a extends in a direction designated B. Another trace 118b is formed on first surface 114 and a further trace 120b is formed on second surface 116. A via 122b is formed to extend through substrate 112 between trace 118b and trace 120b. Trace 118b extends in a direction designated C and trace 120b extends in a direction designated D. In this manner, traces on opposite substrate surfaces can form a criss-cross pattern. Both vias 122a and 122b are the same and therefore only via 122a is further described. Via 122a includes an hourglass shaped sidewall 124 which is formed by a beveled opening 126 in first surface 114 and a second beveled opening 128 in second surface 116. The openings 126 and 128 are of the first size S1 and converge toward the mid-region M of substrate 112 where they are interconnected by an aperture 130 of the second size S2. An electrically conductive surface 132 is formed on sidewall 124 for electrically interconnecting trace 118a and trace 120a.

Referring again to FIG. 2, the beveled openings 26 and 28 gradually slope relative to their respective surfaces 14 and 16, at an angle designated a, see also FIG. 4. Angle a is in the range of from about 20 degrees to about 75 degrees, and is preferably in the range of from about 20 degrees to about 35 degrees. Opening 26, opening 28, and aperture 30, FIG. 2 have a common centroidal axis, as does opening 126, opening 128, and aperture 130, FIG. 4.

Figure 5:
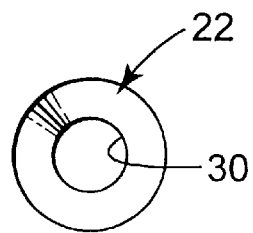
FIG. 5 is a plan view illustrating an embodiment of a via having a generally circular shape.
Figure 6:
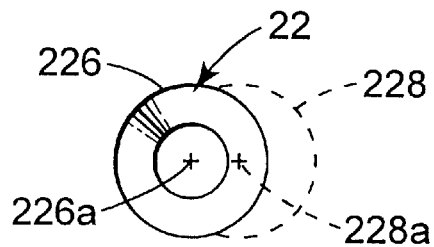
FIG. 6 is a plan view illustrating an embodiment of a via having a generally circular shape and having an opening in one surface of a substrate offset from an opening in an opposite surface of the substrate.
Figure 7:
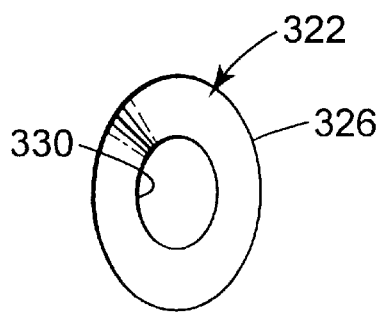
FIG. 7 is a plan view illustrating an embodiment of a via having a generally oblong shape.
Figure 8:
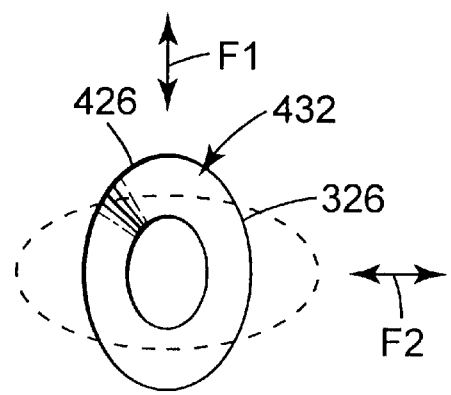
FIG. 8 is a plan view illustrating an embodiment of a via having a generally oblong shape and having an oblong opening in one surface of a substrate extending in a first direction, and an oblong opening in an opposite surface of the substrate extending in a second direction.

The vias described above may be of various shapes and sizes. For example, via 22, FIG. 5, is a generally circular shaped opening including an aperture 30. Alternatively, a via 222, FIG. 6 may include a circular shaped opening 226 and an opposite circular shaped opening 228 which have axially offset centroidal axes 226a and 228a, respectively. In another embodiment, a via 322, FIG. 7, includes a generally oblong shaped opening 326 including an aperture 330. Alternatively, a via 422, FIG. 8 may include an oblong shaped opening 426 and an opposite oblong shaped opening 428, such that the oblong shape of opening 426 extends in a first direction designated F1, and the oblong shape of opening 428 extends in a second direction designated F2, which is skewed at about a 90 degree angle relative to the direction designated F1.

Figure 9:
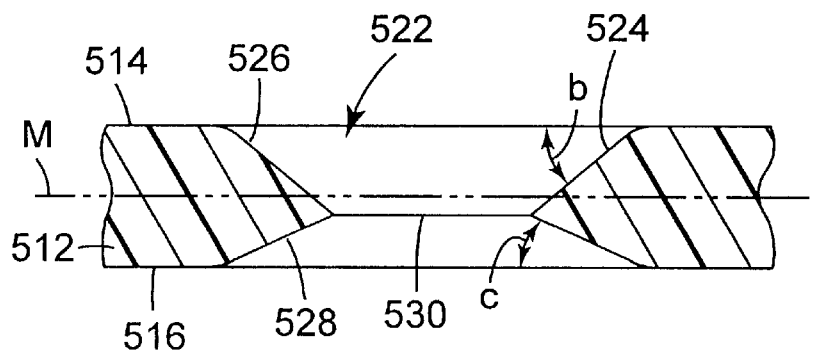
FIG. 9 is a cross-sectional side view illustrating an embodiment of a via having an opening in one surface of a substrate, and another opening in an opposite surface of the substrate, such that the openings intersect at a non mid-region of the substrate.

In a further embodiment, FIG. 9, a substrate 512 includes a first surface 514 and a second opposite surface 516. A via 522 has a substantially hourglass shaped side wall 524 which is formed by simultaneously wet etching substrate 512 from first surface 514 and second surface 516. The via 522 includes a first beveled opening 526 in first surface 514 and a second beveled opening 528 in second surface 516. The openings 526 and 528 converge toward each other where they are interconnected by an aperture 530. However, aperture 530 is not formed at mid-region M, but is formed closer to second surface 516 than to first surface 514. This can be accomplished by either beginning the etch of opening 528 at a delayed time after the etch of opening 526 has begun, or by using an etchant for forming opening 528, which has a lower etch rate than the etchant used to form opening 526. As a further result, the beveled openings 526 and 528 gradually slope relative to their respective surfaces 514 and 516, however, opening 526 slopes at an angle designated b, and opening 528 slopes at an angle designated c. The angles b and c are however, within the above-mentioned ranges of from about 20 degrees to about 75 degrees, and preferably in the range of from about 20 degrees to about 35 degrees.

Figure 10:
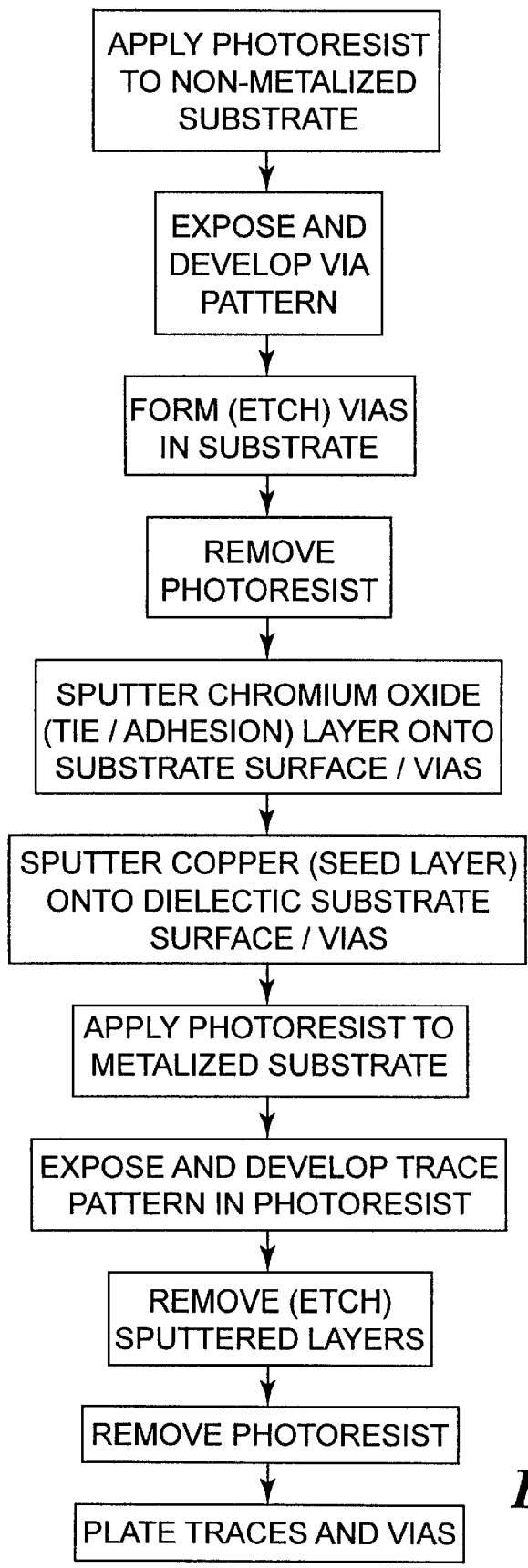
FIG. 10 is a diagrammatic view illustrating an embodiment of a flow chart including steps used in forming conductive vias in a flexible substrate.

FIG. 10 illustrates a method of fabricating conductive feedthroughs preferably formed in a 2 metal layer flexible circuit according to the present invention by a post-etch metallization process. A layer of photoresist is applied to each side of a suitable flexible circuit dielectric layer. Preferably, the dielectric layer is a 1.0 to 2.0 mil thick polyimide such as the product sold under the name Dupont Kapton E. Depending on the application, typical thickness for of the dielectric layer for flexible circuits will be in the range of 1.0 mils to 4.0 mils. A positive or negative acting photoresist can be used. The photoresist layer is imaged and then exposed to produce a pattern defining where each feedthrough will be etched through the dielectric layer. The dielectric layer is then etched from both sides in a wet etching process capable of etching the dielectric layer in the exposed regions of photoresist. A feedthrough having the profile shown in FIG. 4 could also be attained using a laser ablation process, a dry etching process such as plasma etching, or a laser drilling. Laser drilling, laser ablation, and plasma etching processes are well known in the art and would also provide a suitable means of fabricating the desired feedthrough profile.

The minor and major diameters, S1 and S2, FIG. 4, respectively, of the feedthrough in a flexible circuit dielectric substrate produced by wet etching are significantly smaller than that attainable with prior art single side wet etching process. For a desired minor diameter of 25 $\mu$m in a 2 mil thick dielectric substrate, the calculated nominal major diameter S1 for an anisotropic wet etching process will be roughly 125 $\mu$m. However, experimentation has found that the actual major diameter S1 can be as low as 100 $\mu$m. It is believed that a nominal level of anisotropic characteristics are being imparted by material property variations throughout the thickness of the dielectric material.

Following etching of the dielectric layer, the photoresist is stripped and the dielectric substrate is metallized. In a preferred metallization process, the dielectric layer would first be coated with a metal oxide layer and then a thin conductive base layer. The metal oxide layer is well known in the art to increase adhesion of the conductive base layer to the polymeric dielectric layer. Generally, the metal for the metal oxide layer will be selected from the group of metals including chromium, iron, nickel, molybdenum, manganese, zirconium, or mixtures thereof. Chromium is the preferred material. The conductive base layer is preferably copper although it may be a material selected from the group of metals including aluminum, gold, tin and silver. The methods for depositing the metal oxide layer and the conductive base layer are well known in the art. They include RF sputtering, ion beam, sputtering, and chemical vapor deposition.

The formation of conductive feedthroughs is completed by applying a layer of photoresist to each side of the circuit substrate, exposing and developing the photoresist to produce the desired pattern for the first side circuit traces and the desired pattern for the second side circuit trace patterns. The substrate is then etched to remove the exposed conductive base layer and metal oxide layer. As shown in FIGS. 1 and 3, the resulting circuit has traces on either side of the dielectric layer with now conductive feedthroughs connecting at least a portion of the traces on opposing sides. The circuit may now be exposed to an electroplating process to provide a thicker layer of conductive material on the metallized regions. Other methods which could also be used to include a pre-etch metallization process and an electroless plating process.

As it can be seen, the principal advantages of these embodiments are that the structure of the circuit and via is improved by modifying the features which cause the aforementioned problems in conventional circuits. These modified features alleviate the problems associated with work hardening of the copper and the accumulation of tensile forces. The heretofore abrupt transition of the copper over the lip of the via (i.e. the 90 degree angle) is modified to be much more gradual. As a result, the flexing of the copper which causes the work hardening, is spread over a greater area, and the total angle of flexure, at any point, is greatly reduced. Thus, stress in the copper is reduced and the life of the circuit and via is extended. Also, the number of vias in a given area is substantially increased enabling a greater number of I/O's. Further, a more uniform metallization of conductive surfaces in the vias is possible.

As a result, one embodiment provides a flexible circuit comprising a flexible non-conductive substrate having a first surface and a second surface. A first electrically conductive trace is provided on the first surface and a second electrically conductive trace is provided on the second surface. A via extends through the substrate from the first trace to the second trace. The via has a substantially hourglass shaped side wall which substantially converges between the first surface and the second surface. An electrically conductive surface is provided on the passage for electrically interconnecting the first trace and the second trace.

Another embodiment provides a flexible circuit including a via extending through the substrate from an end of the first trace to an end of the second trace. The via includes a first beveled opening of a first size formed in the first surface and a second beveled opening of the first size formed in the second surface. The first and second openings are interconnected by an aperture of a second size, less than the first size. An electrically conductive surface is provided in the via for interconnecting the first trace with the second trace.

Another embodiment provides a method of forming a double-sided flexible circuit which includes forming a first electrically conductive trace on a first surface of a nonconductive flexible substrate. A second electrically conductive trace is formed on a second surface of the substrate. A via is formed to extend through the substrate from the first trace to the second trace. The via is shaped with a substantially shaped side wall, and an electrically conductive surface is formed on the side wall for electrically interconnecting the first trace and the second trace.

Another embodiment provides a method of forming a double-sided flexible circuit which includes forming a first electrically conductive trace on a first surface of a polymeric film. A second electrically conductive trace is formed on a second surface of the polymeric film. The film is wet etched simultaneously from both sides to form a via through the film. The via has a first beveled opening in the first surface and a second beveled opening in the second surface so that the first and second openings converge to define an interconnecting opening between the first and second surfaces of the film. An electrically conductive surface is formed in the via for electrically interconnecting the first trace and the second trace.

A further embodiment provides a double-sided flexible circuit including a thin film substrate formed of a material suitable for a wet etch applied simultaneously to a first surface and a second surface of the substrate to form a via through the substrate. A first electrically conductive trace is provided on the first surface and a second electrically conductive trace is provided on the second surface. The via includes a first beveled opening of a first size formed in the first surface and a second beveled opening of the first size in the second surface. The first and second openings are interconnected by an aperture of a second size, less than the first size. An electrically conductive surface is provided on the via for electrically interconnecting the first trace and the second trace.

Although illustrative embodiments have been shown and described, a wide range of modifications, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A flexible circuit comprising:
   formed of an electrically insulating material having a first surface and a second surface;
   a first electrically conductive trace on the first surface and a second electrically conductive trace on the second surface;
   a passage extending through the substrate from an end of the first trace to an end of the second trace, the passage including a first beveled opening of a first size formed in the first surface, and a second beveled opening of the first size formed in the second surface, the first and second openings being interconnected by an aperture of a second size, less than the first size; and
   an electrically conductive surface on the passage for electrically interconnecting the first trace and the second trace wherein the first beveled opening is gradually sloped into the first surface and the second beveled opening is gradually sloped into the second surface so that the first and second beveled openings intersect at the aperture wherein a centroidal axis of the first beveled opening is offset from a centroidal axis of the second beveled opening.

2. A flexible circuit comprising:
   a flexible substrate formed of an electrically insulating material having a first surface and a second surface;
   a first electrically conductive trace on the first surface and a second electrically conductive trace on the second surface;
   a passage extending through the substrate from an end of the first trace to an end of the second trace, the passage including a first beveled opening of a first size formed in the first surface, and a second beveled opening of the first size formed in the second surface, the first and second openings being interconnected by an aperture of a second size, less than the first size; and
   an electrically conductive surface on the passage for electrically interconnecting the first trace and the second trace wherein the first beveled opening is gradually sloped into the first surface and the second beveled opening is gradually sloped into the second surface so that the first and second beveled openings intersect at the aperture wherein the first and second beveled openings and the aperture are substantially of a non-circular shape.

3. The flexible circuit as defined in claim 2 wherein the first beveled opening is oblong and extends in a first direction and the second beveled opening is oblong and extends in a second direction, different from the first direction.

4. A flexible circuit formed of an electrically insulating material having a first surface and a second surface;
   a first electrically conductive trace on the first surface and a second electrically conductive trace on the second surface;
   a passage extending through the substrate from an end of the first trace to an end of the second trace, the passage including a first beveled opening of a first size formed in the first surface, and a second beveled opening of the first size formed in the second surface, the first and second openings being interconnected by an aperture of a second size, less than the first size; and
   an electrically conductive surface on the passage for electrically interconnecting the first trace and the second trace wherein the first beveled opening is gradually sloped into the first surface and the second beveled opening is gradually sloped into the second surface so that the first and second beveled openings intersect at the aperture wherein the aperture is positioned from the first surface at a first distance, and is positioned from the second surface at a second distance greater than the first distance.

5. A flexible circuit formed of an electrically insulating material having a first surface and a second surface;
   a first electrically conductive trace on the first surface and a second electrically conductive trace on the second surface;
   a passage extending through the substrate from an end of the first trace to an end of the second trace, the passage including a first beveled opening of a first size formed in the first surface, and a second beveled opening of the first size formed in the second surface, the first and second openings being interconnected by an aperture of a second size, less than the first size; and
   an electrically conductive surface on the passage for electrically interconnecting the first trace and the second trace wherein the first beveled opening is gradually sloped into the first surface and the second beveled opening is gradually sloped into the second surface so that the first and second beveled openings intersect at the aperture wherein the first opening is beveled at a first angle from the first surface, and the second opening is beveled at a second angle from the second surface, the first angle being different from the second angle.

* * * * *